United States Patent
Kumar et al.

(10) Patent No.: US 12,033,687 B2
(45) Date of Patent: Jul. 9, 2024

(54) COMPUTER MEMORY SYSTEMS EMPLOYING LOCALIZED GENERATION OF GLOBAL BIT LINE (GBL) CLOCK SIGNAL TO REDUCE CLOCK SIGNAL READ PATH DIVERGENCE FOR IMPROVED SIGNAL TRACKING, AND RELATED METHODS

(71) Applicant: Microsoft Technology Licensing, LLC, Redmond, WA (US)

(72) Inventors: Rajesh Kumar, Apex, NC (US); Sai Prakash Reddy Bijivemula, Durham, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 158 days.

(21) Appl. No.: 17/831,129

(22) Filed: Jun. 2, 2022

(65) Prior Publication Data
US 2023/0395127 A1 Dec. 7, 2023

(51) Int. Cl.
*G11C 7/22* (2006.01)
*G11C 11/4076* (2006.01)
(Continued)

(52) U.S. Cl.
CPC ...... *G11C 11/4085* (2013.01); *G11C 11/4076* (2013.01); *G11C 11/4087* (2013.01); *G11C 11/4094* (2013.01)

(58) Field of Classification Search
CPC ............ G11C 11/4085; G11C 11/4076; G11C 11/4087; G11C 11/4094
See application file for complete search history.

(56) References Cited

U.S. PATENT DOCUMENTS

| | | | |
|---|---|---|---|
| 9,384,795 B1* | 7/2016 | Hoff | G11C 7/22 |
| 2013/0088926 A1* | 4/2013 | Tao | G11C 7/10 |
| | | | 365/191 |

(Continued)

FOREIGN PATENT DOCUMENTS

WO 2016175958 A2 11/2016

OTHER PUBLICATIONS

Amrutur, et al., "A Replica Technique for Wordline and Sense Control in Low-Power SRAM's", In Journal of IEEE Journal of Solid-State Circuits, vol. 33, Issue 8, Aug. 1998, pp. 1208-1219.

(Continued)

*Primary Examiner* — Mushfique Siddique
(74) *Attorney, Agent, or Firm* — Withrow & Terranova, PLLC

(57) ABSTRACT

Computer memory systems employing localized generation of a global bit line (GBL) clock signal to reduce clock signal read path divergence for improved signal tracking, and related methods. The memory system includes one or more memory banks that each include a memory array comprised memory bit cells organized in respective memory row and memory column circuits. A global bit line (GBL) keeper circuit in a GBL control path in the memory system is coupled to the GBLs to latch output read data from a word line path in a selected memory row circuit of a selected memory bank in a read operation. To improve tracking of timing of the GBL control path with the word line paths in the memory row circuits, a GBL clock signal and local WL clock signal in a given memory bank are separately sourced from a source clock locally within the selected memory bank.

25 Claims, 7 Drawing Sheets

(51) Int. Cl.
    *G11C 11/408*     (2006.01)
    *G11C 11/4094*     (2006.01)

(56) References Cited

U.S. PATENT DOCUMENTS

| | | | |
|---|---|---|---|
| 2014/0247675 A1* | 9/2014 | Tao | G11C 7/227 |
| | | | 365/189.15 |
| 2021/0098052 A1 | 4/2021 | Katoch et al. | |

OTHER PUBLICATIONS

"International Search Report and Written Opinion Issued in PCT Application No. PCT/US23/018774", dated Aug. 30, 2023, 12 Pages. (MS# 411304-WO-PCT).

* cited by examiner

COMPUTER MEMORY SYSTEMS EMPLOYING LOCALIZED GENERATION OF GLOBAL BIT LINE (GBL) CLOCK SIGNAL TO REDUCE CLOCK SIGNAL READ PATH DIVERGENCE FOR IMPROVED SIGNAL TRACKING, AND RELATED METHODS

FIELD OF THE DISCLOSURE

The technology of the disclosure relates to computer memory systems, and more particularly to memory arrays that are implemented with multiple memory banks to improve memory performance and power consumption.

BACKGROUND

Processor-based systems including memory systems support read and write operations from a central processing unit (CPU) or other processor. Memory may be used for data storage as well as to store program code for storing instructions to be executed. Such processor-based systems conventionally employ both cache and non-cache, system memory. For example, a processor may include local cache memory. Multiple CPUs in a processor-based system may have access to a shared cache memory. The processor-based system also employs a main or system memory that contains memory storage units (i.e., memory bit cells) over the entire physical address space of the processor-based system. Each of these different types of memories employ memory arrays that include memory bit cells typically organized in a row and column structure for storing data. A memory row that contains a memory bit cell in a respective column is accessed to read or write a data word from memory. The memory bit cells can be provided in different technologies of memory, such as static random access memory (RAM) (SRAM) bit cells, and dynamic RAM (DRAM).

It is typically desired to implement memory systems with large sized memory arrays using multiple memory banks to improve memory performance and power consumption. Providing multiple memory banks in a memory system splits the memory capacity among different arrays that can each be accessed independently. Also, providing separately memory banks in a memory system means that the power consumption can be managed for each memory bank independently of another memory bank. Thus for example, if software or data is persistent in one portion of memory, but not another, these separate portions of memory can be split into separate memory banks so that each can be separately powered down or idled to conserve power without affecting the other which may be fully powered for memory accesses.

A tradeoff of employing memory banking in a memory system is that such requires hierarchical clock signals to control and optimize read critical path timings as well as the read dynamic power consumption. Different control signals are generated at the local memory bank level and at a global level where signals from different memory banks (e.g., global bit lines (GBLs)) are combined to produce the final output read data. For example, a local word line (WL) clock signal that is used to control the timing of a local decoding operation in the selected memory bank for a read operation may be generated off of a global source clock. Also, a GBL clock signal that is generated off of the same source clock may be used to control the timing of a GBL keeper circuit that latches the data value of the output read data from the selected memory array before the next read operation. The global and local path timings of the memory system need to be coordinated or tracked to each other to avoid memory data glitches and performance delays. For example, if the GBL clock signal causes the GBL keeper circuit to latch the GBLs before the local WL clock signal causes the new data from a memory read to be asserted on the GBLs, the GBL keeper circuit may be in contention with GBL driver circuits. On the other hand, if the GBL clock signal is over delayed to delay the latching of the GBL keeper circuit, this can keep the GBLs in a floating condition for a longer duration even after the output read data is available, thus increasing memory access time. Providing tracking of these clock signals becomes even more difficult across different process, voltage, and temperature (PVT) variations.

SUMMARY

Exemplary aspects disclosed herein include a computer memory system employing localized generation of a global bit line (GBL) clock signal to reduce clock signal read path divergence for improved signal tracking. Related methods are also disclosed. The memory system includes one or more memory banks that each include a memory array comprised of a plurality of memory bit cells organized in respective memory row and memory column circuits. A memory word is read or written by selecting a memory row circuit in a word line (WL) path according to a decoded memory address decoded by a decode circuit(s). The memory system includes a global decode circuit that decodes the memory address for the memory operation to select the memory bank for the memory access. Each memory bank includes a local decode circuit that further decodes the memory address to select the corresponding memory row circuit in the memory array for the memory access. Each memory row circuit in each of the one or more memory banks in the memory system is coupled to global bit lines (GBLs). A selected memory row circuit in a selected memory bank for a read operation asserts its output read data on the GBLs to be provided to a requesting circuit in a computer system. A GBL keeper circuit in a GBL control path in the memory system is coupled to the GBLs to latch the output read data from a WL path in a selected memory row circuit of a selected memory bank in a read operation. A local WL clock signal and a GBL clock signal that are both sourced from a source clock, control the respective timings of a selected memory row circuit in a selected memory bank and the timing of the GBL control path in a read operation. It is important that timing of the GBL control path be synchronized (i.e., tracked) with timing of the word line path. This is so that output read data asserted by the selected memory row circuit on the GBLs is not latched by the GBL keeper circuit too early, thus causing contention on the GBLs with another prior accessed memory, or too late, thus increasing memory access times. In this regard, delay circuits can be inserted in a GBL control path to track these timing paths based on the different circuit paths of the local WL clock signal and GBL clock signal. However, tracking becomes even more challenging based on the effect that different process, voltage, and temperature (PVT) variations have on access paths. Increasing the delay of the delay circuits in the GBL control path can offset the effect from PVT variations, but at a cost of reduced memory access times.

In this regard, in exemplary aspects, to improve the tracking of the timing of the GBL control path with the word line paths of the memory row circuits in a memory bank, the GBL clock signal and the local WL clock signal in a given memory bank are separately sourced from a source clock locally within the selected memory bank. This is opposed to separately sourcing the GBL clock signal and the local WL clock signal outside the selected memory bank in a global area of the memory system wherein the path lengths of the separated GBL clock signal and the local WL clock signal would be longer than if such clock signals were generated locally within a selected memory bank. In this manner, the separate and distinct path lengths that the GBL clock signal and the local WL clock signal take after being separately sourced from the source clock are reduced. This can reduce timing differences that can occur in their separate GBL control and WL paths as variations of PVT in the memory system. In order to generate the GBL clock signal and the local WL clock signal locally in a selected memory bank, a clock control generation circuit is provided locally in the memory bank and is coupled between the global decode circuit and each of the memory row circuits in the memory bank. In this manner, when a given memory bank is selected for a read operation as a result of a decode operation from the global decode circuit, the clock control generation circuit receives an indication that its memory bank has been selected. The clock control generation circuit can then use the indication of its memory bank being selected to generate the GBL clock signal and the local WL clock signals. In an exemplary aspect, the clock control generation circuit can be implemented as an OR-based logic circuit coupled to each of the memory row circuits, wherein the GBL clock signal and the local WL clock signals are generated as a result of the selection of any of the memory row circuits in the selected memory bank. In an example, the OR-based logic circuit in the clock control generation circuit can be provided as a dynamic circuit wherein separate transistors are coupled to each memory row circuit and a common pre-charge line. In this manner, if any of the memory row circuits in a given memory bank are selected, the pre-charge line is pulled down to an activated state to cause the GBL clock signal to be generated in the GBL control path.

In another exemplary aspect, the memory banks in the memory system include separate memory sub-banks that are controlled by a memory sub-bank control circuit. The memory sub-bank control circuit includes circuits that also need to be clocked by a clock signal sourced from the source clock to control the multiplexing of the outputs of the memory row circuits from each of the separate memory sub-banks onto the GBLs. It is also important that the timing of the circuit path in the memory sub-bank control circuit tracks the WL path of the selected memory row circuit in the selected memory sub-bank so that the read output data from the selected memory row circuit is not asserted too early or too late on the GBLs. In this regard, in another example, the clock control generation circuit is also configured to generate a local memory sub-bank clock signal that controls the timing of a memory sub-bank control path in the memory sub-bank control circuit. The clock control generation circuit is configured to separately generate (i.e., split) the memory sub-bank clock signal from the source block as well as the GBL clock signal and the local WL clock signal.

In this regard, in one exemplary aspect, a memory system is provided. The memory system comprises a first memory array, comprising a plurality of first memory row circuits. Each first memory row circuit of the plurality of first memory row circuits is configured to generate a first output read data to be coupled on a plurality of global bit lines (GBLs) in response to first global read word line (RWL) signals on a plurality of global RWLs indicating the selection of a first memory row circuit of the plurality of first memory row circuits for a first read operation, and in response to a first local WL clock signal. The memory system also comprises a GBL keeper circuit coupled to the plurality of GBLs. The GBL keeper circuit is configured to latch the first output read data on the plurality of GBLs in response to a GBL clock signal. The memory system also comprises a clock control generation circuit comprising a local clock node. The clock control generation circuit is configured to receive a source clock, receive the first global RWL signals over the plurality of global RWLs indicating the first read operation into the first memory array, and in response to receiving the first global RWL signals: generate the first local WL clock signal from the received source clock on the local clock node; and generate the GBL clock signal from the received source clock on the local clock node.

In another exemplary aspect, a method of generating a GBL clock signal clocking a GBL keeper circuit in a memory system is provided. The method comprises receiving a source clock. The method also comprises receiving first global RWL signals on a plurality of global RWLs indicating a first read operation to a selected first memory row circuit of a plurality of first memory row circuits. In response to receiving the first global RWL signals, the method also comprises generating a first local WL clock signal from the received source clock on a local clock node, generating a GBL clock signal from the received source clock on the local clock node, and generating a first output read data from the selected first memory row circuit to be coupled on a plurality of GBLs in response to the first global RWL signals on the plurality of global RWLs indicating the selection of the first memory row circuit and the first local WL clock signal. The method also comprises latching the first output read data on the plurality of GBLs in response to the GBL clock signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 is a block diagram of an exemplary processor-based system that includes a plurality of central processing units (CPUs) each configured to access local and shared cache memory, and system memory to read and write data;

FIG. 2 is a diagram of an exemplary memory system that includes sourcing of a global bit line (GBL) clock signal to clock a GBL keeper circuit in a GBL control path outside memory banks, and the sourcing of a local word line (WL) clock signal local and local memory sub-bank clock signal within the memory banks for clocking a memory row circuit and the memory sub-bank control circuit in the respective WL and memory sub-bank control paths within the memory bank;

Figure 4:
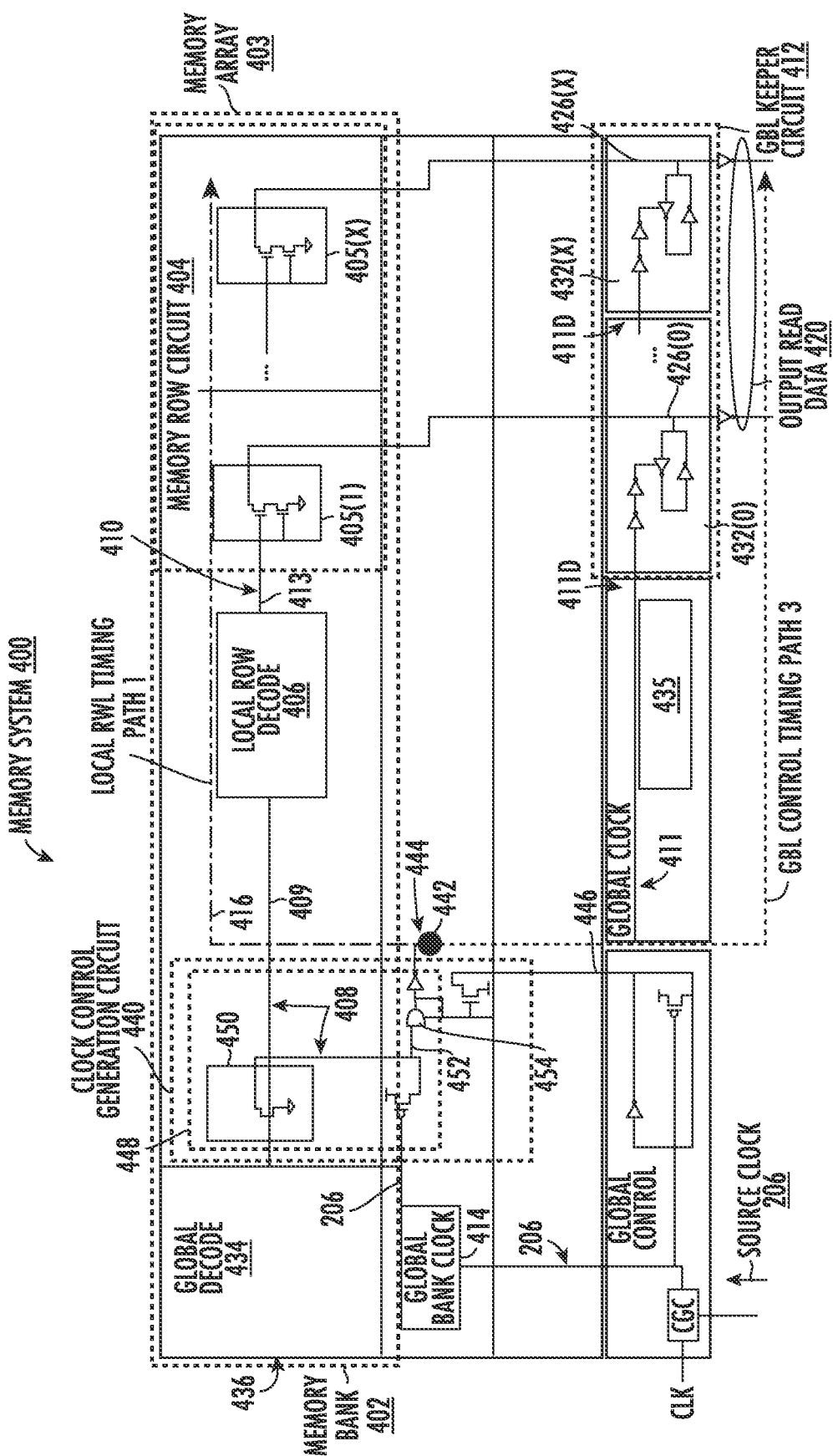
FIG. 4 is a circuit diagram of another exemplary memory system that includes a memory bank among one or more memory banks, and wherein the GBL clock signal and local WL clock signal local that control the timing of the respective GBL control path and a WL path in a selected memory row circuit in the memory bank are both sourced locally from a source clock within the memory bank.
Figure 5:
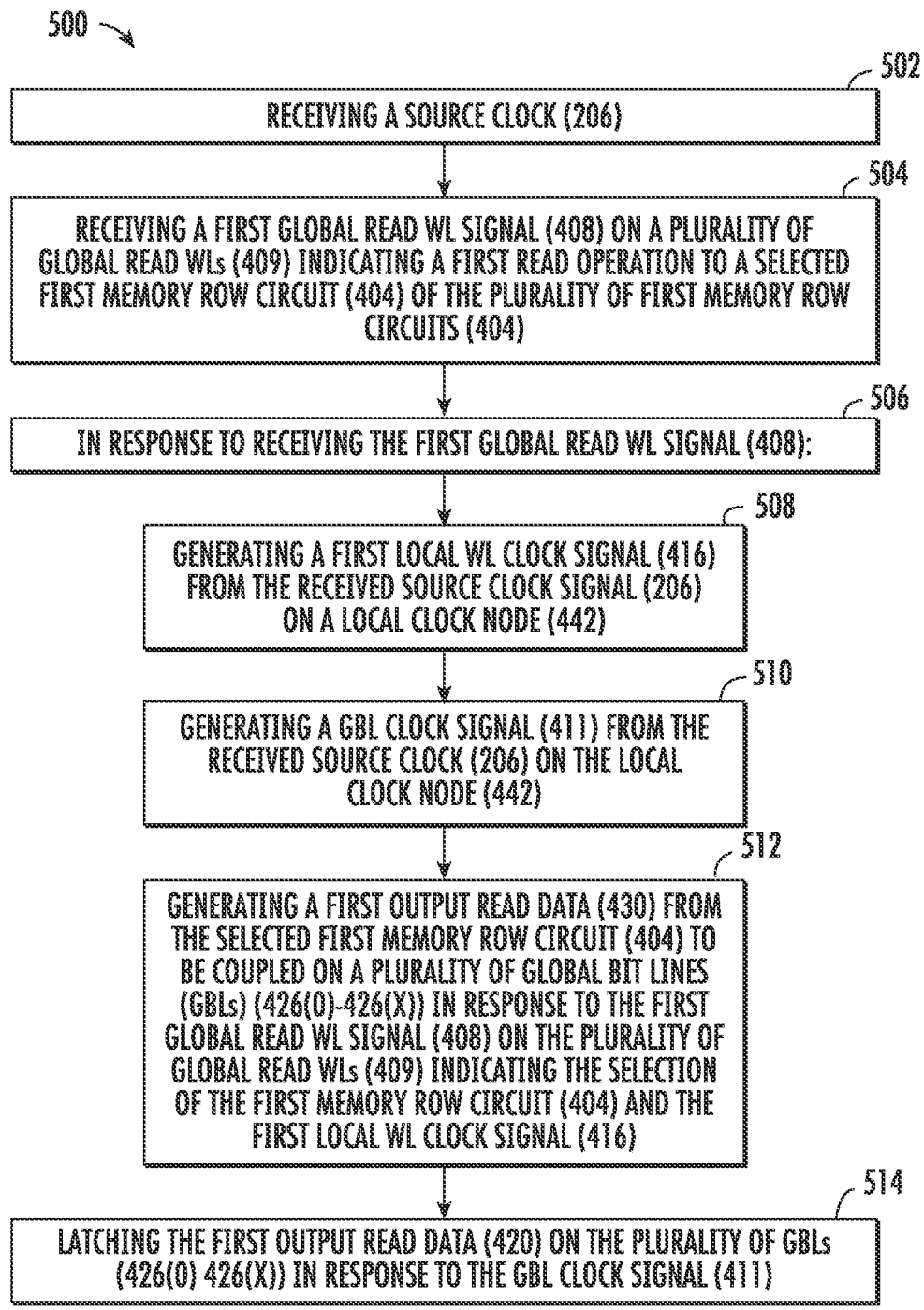
FIG. 5 is a flowchart illustrating an exemplary read operation process performed in a selected memory row circuit in a selected memory bank in a memory system, wherein the GBL clock signal and local WL clock signal local are both sourced locally from a source clock within the memory bank.
Figure 6:
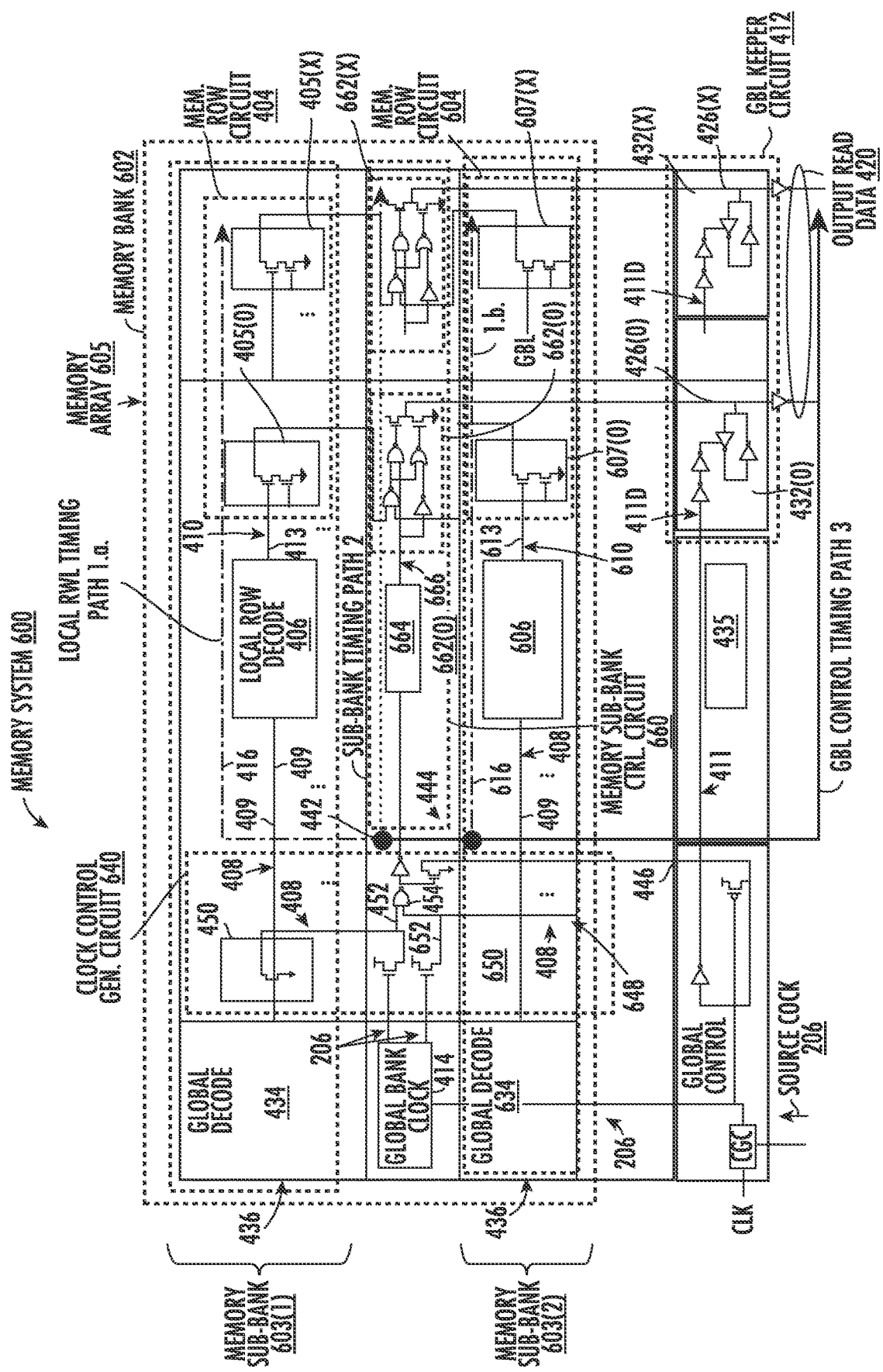
Figure 7:
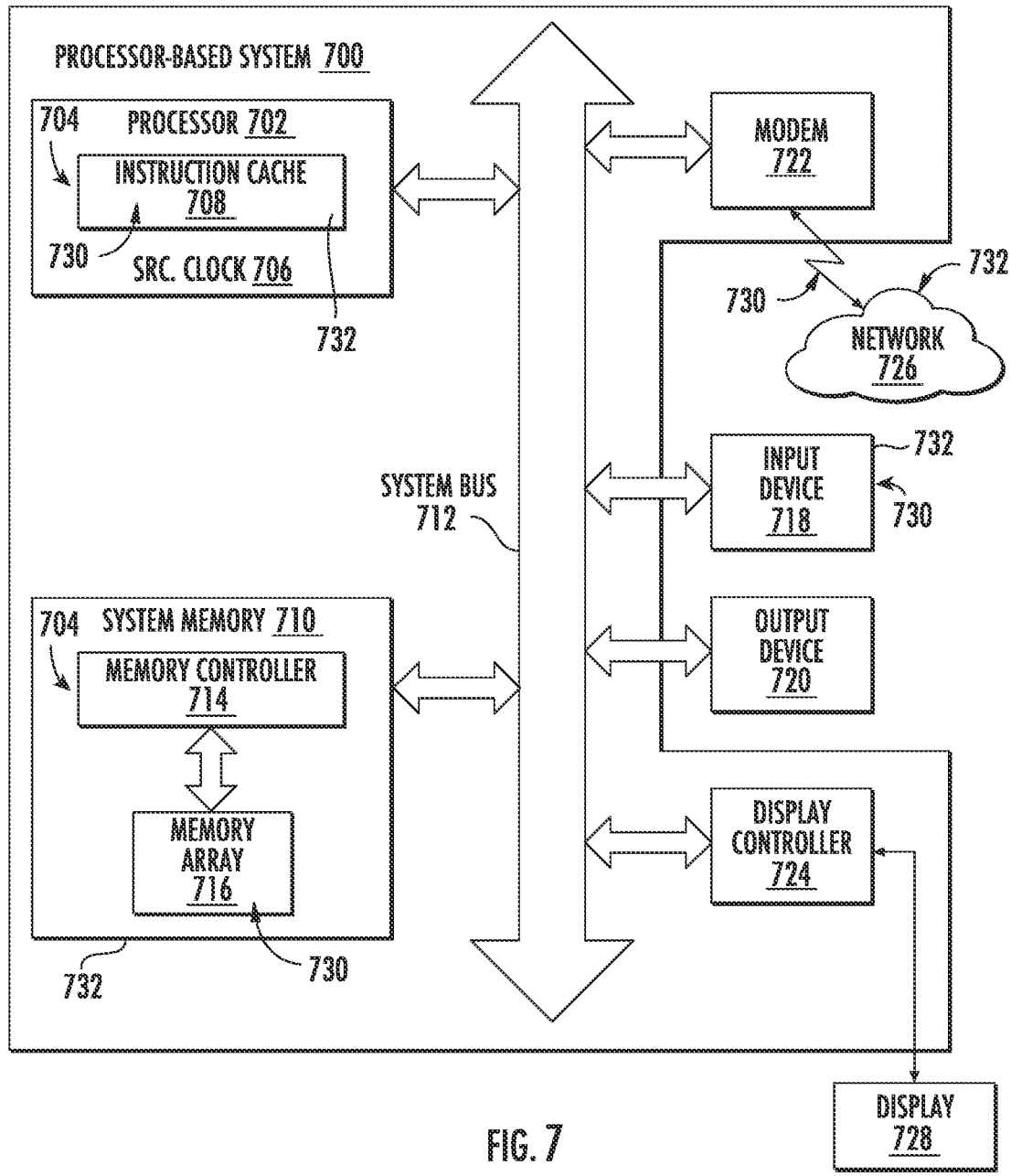

FIG. 6 is a circuit diagram of another exemplary memory system that includes a memory bank with multiple memory sub-banks, and wherein a GBL clock signal, a local WL clock signal, and local memory sub-bank clock signal are all sourced from a source clock locally within the memory bank; and FIG. 7 is a block diagram of an exemplary processor-based system that can be provided in an integrated circuit (IC) chip, wherein the processor-based system includes a processor and a memory system that includes a memory bank among one or more memory banks, wherein the GBL clock signal and local WL clock signal local that control the timing of the respective GBL control path and a WL path in a selected memory row circuit in the memory bank are both sourced locally from a source clock within the memory bank, including, without limitation, the memory circuits in FIGS. 4 and 5.

DETAILED DESCRIPTION

Exemplary aspects disclosed herein include a computer memory system employing localized generation of a global bit line (GBL) clock signal to reduce clock signal read path divergence for improved signal tracking. Related methods are also disclosed. The memory system includes one or more memory banks that each include a memory array comprised of a plurality of memory bit cells organized in respective memory row and memory column circuits. A memory word is read or written by selecting a memory row circuit in a word line (WL) path according to a decoded memory address decoded by a decode circuit(s). The memory system includes a global decode circuit that decodes the memory address for the memory operation to select the memory bank for the memory access. Each memory bank includes a local decode circuit that further decodes the memory address to select the corresponding memory row circuit in the memory array for the memory access. Each memory row circuit in each of the one or more memory banks in the memory system is coupled to global bit lines (GBLs). A selected memory row circuit in a selected memory bank for a read operation asserts its output read data on the GBLs to be provided to a requesting circuit in a computer system. A GBL keeper circuit in a GBL control path in the memory system is coupled to the GBLs to latch the output read data from a WL path in a selected memory row circuit of a selected memory bank in a read operation. A local WL clock signal and a GBL clock signal that are both sourced from a source clock, control the respective timings of a selected memory row circuit in a selected memory bank and the timing of the GBL control path in a read operation. It is important that timing of the GBL control path be synchronized (i.e., tracked) with timing of the word line path. This is so that output read data asserted by the selected memory row circuit on the GBLs is not latched by the GBL keeper circuit too early, thus causing contention on the GBLs with another prior accessed memory, or too late, thus increasing memory access times. In this regard, delay circuits can be inserted in a GBL control path to track these timing paths based on the different circuit paths of the local WL clock signal and GBL clock signal. However, tracking becomes even more challenging based on the effect that different process, voltage, and temperature (PVT) variations have on access paths. Increasing the delay of the delay circuits in the GBL control path can offset the effect from PVT variations, but at a cost of reduced memory access times.

In this regard, in exemplary aspects, to improve the tracking of the timing of the GBL control path with the word line paths of the memory row circuits in a memory bank, the GBL clock signal and the local WL clock signal in a given memory bank are separately sourced from a source clock locally within the selected memory bank. This is opposed to separately sourcing the GBL clock signal and the local WL clock signal outside the selected memory bank in a global area of the memory system wherein the path lengths of the separated GBL clock signal and the local WL clock signal would be longer than if such clock signals were generated locally within a selected memory bank. In this manner, the separate and distinct path lengths that the GBL clock signal and the local WL clock signal take after being separately sourced from the source clock are reduced. This can reduce timing differences that can occur in their separate GBL control and WL paths as variations of PVT in the memory system. In order to generate the GBL clock signal and the local WL clock signal locally in a selected memory bank, a clock control generation circuit is provided locally in the memory bank and is coupled between the global decode circuit and each of the memory row circuits in the memory bank. In this manner, when a given memory bank is selected for a read operation as a result of a decode operation from the global decode circuit, the clock control generation circuit receives an indication that its memory bank has been selected. The clock control generation circuit can then use the indication of its memory bank being selected to generate the GBL clock signal and the local WL clock signals. In an exemplary aspect, the clock control generation circuit can be implemented as an OR-based logic circuit coupled to each of the memory row circuits, wherein the GBL clock signal and the local WL clock signals are generated as a result of the selection of any of the memory row circuits in the selected memory bank. In an example, the OR-based logic circuit in the clock control generation circuit can be provided as a dynamic circuit wherein separate transistors are coupled to each memory row circuit and a common pre-charge line. In this manner, if any of the memory row circuits in a given memory bank are selected, the pre-charge line is pulled down to an activated state to cause the GBL clock signal to be generated in the GBL control path.

Examples of computer memory systems employing localized generation of a GBL clock signal to reduce clock signal read path divergence for improved signal tracking start at FIG. 4. Before discussing these memory systems, an exemplary processor-based system that includes memory systems includes sourcing of a global bit line (GBL) clock signal to clock a GBL keeper circuit in a global GBL control path outside of memory banks in the memory system are first described in FIGS. 1-3 below.

Figure 1:
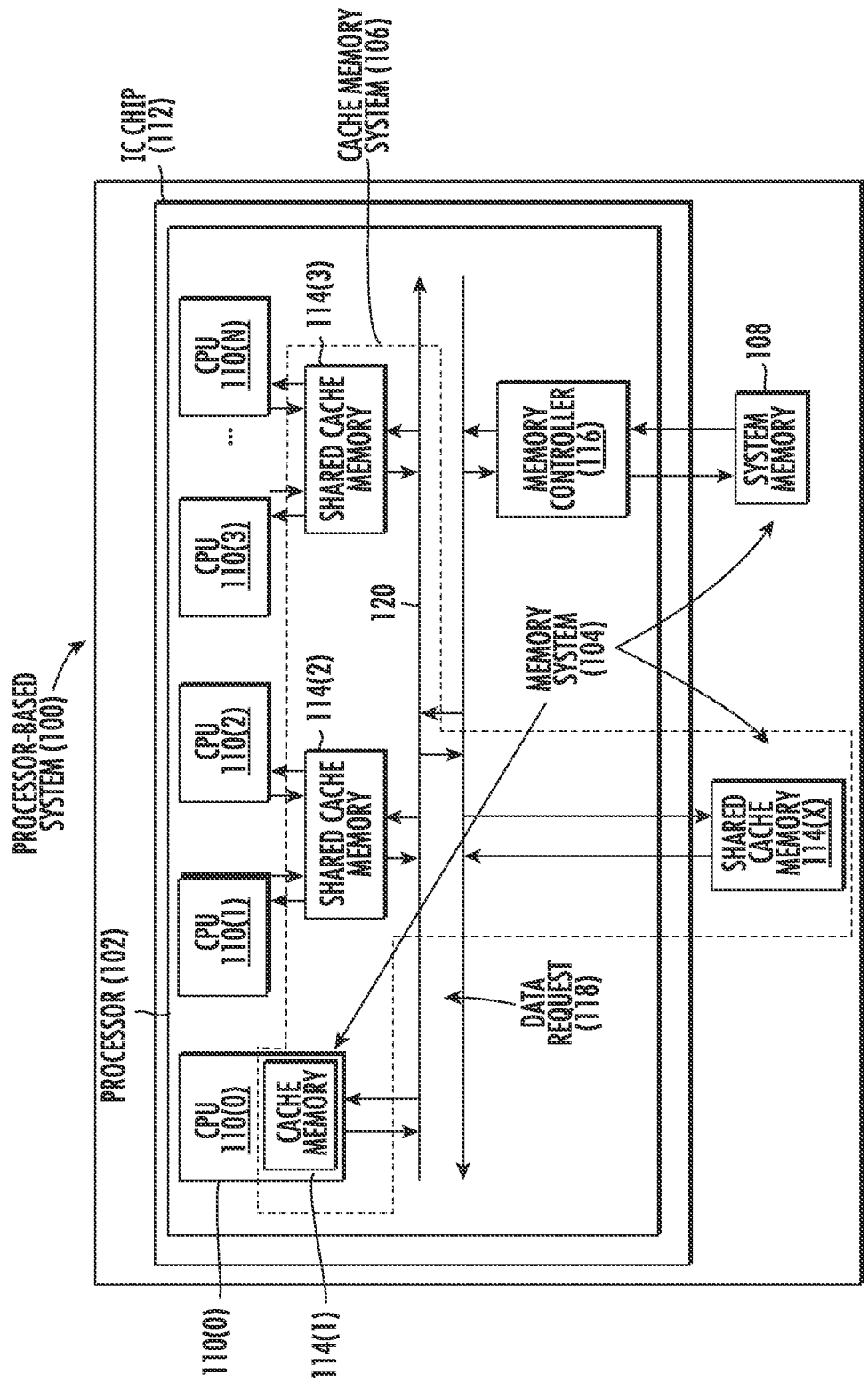

In this regard, FIG. 1 is a diagram of an exemplary processor-based system 100 that includes a processor 102 configured to issue memory requests (i.e., data read and data write requests) to a memory system 104. The memory system 104 includes a cache memory system 106 and a system memory 108. The system memory 108 is a memory that is fully addressable by the physical address (PA) space of the processor-based system 100. For example, the system memory 108 may be a dynamic random access memory (DRAM) provided in a separate DRAM chip. The processor 102 includes one or more respective CPUs 110(0)-110(N), wherein 'N' is a positive whole number representing the number of CPUs included in the processor 102. The processor 102 can be packaged in an integrated circuit (IC) chip 112.

With continuing reference to FIG. 1, the cache memory system 106 includes one or more cache memories 114(1)-114(X), where 'X' is a positive whole number representing the number of cache memories included in the processor 102. The cache memories 114(1)-114(X) may be at different hierarchies in the processor-based system 100 and that are logically located between the CPUs 110(0)-110(N) and the system memory 108. A memory controller 116 controls access to the system memory 108. For example, a CPU 110(0)-110(N) as a requesting device may issue a data request 118 to read data in response to processing a load instruction. The data request 118 includes a target address of the data to be read from memory. Using CPU 110(0) as an example, if the requested data is not in a private cache memory 114(1) (i.e., a cache miss to cache memory 114(1)) which may be considered a level one (L1) cache memory, the private cache memory 114(1) sends the data request 118 over an interconnect bus 120 in this example to a shared cache memory 114(X) shared with all of the CPUs 110(0)-110(N), which may be a level 3 (L3) cache memory. The requested data in the data request 118 is eventually either fulfilled in the cache memory 114(1)-114(X) or the system memory 108 if not contained in any of the cache memories 114(1)-114(X).

The cache memories 114(1)-114(X) and/or the system memory 108 in the memory system 104 in FIG. 1 can employ memory arrays that include memory bit cells typically organized in a row and column structure for storing data. A memory row that contains a memory bit cell in a respective column is accessed to read or write a data word from memory. The memory bit cells can be provided in different technologies of memory, such as static random access memory (RAM) (SRAM) bit cells, and dynamic RAM (DRAM). As another example, the system memory 108 may be implemented with multiple large sized memory arrays using multiple memory banks to improve memory performance and power consumption. Providing multiple memory banks in a memory in the memory system 104 can split the memory capacity among different arrays that can each be accessed independently by the CPUs 110(1)-110(N). Also, providing separate memory banks in the memory system 104 means that the power consumption can be managed for each memory bank independently of another memory bank. Thus for example, if software or data is persistent in one portion of memory, but not another, these separate portions of memory can be split into separate memory banks so that each can be separately powered down or idled to conserve power without affecting the other, which may be fully powered for memory accesses.

Figure 2:
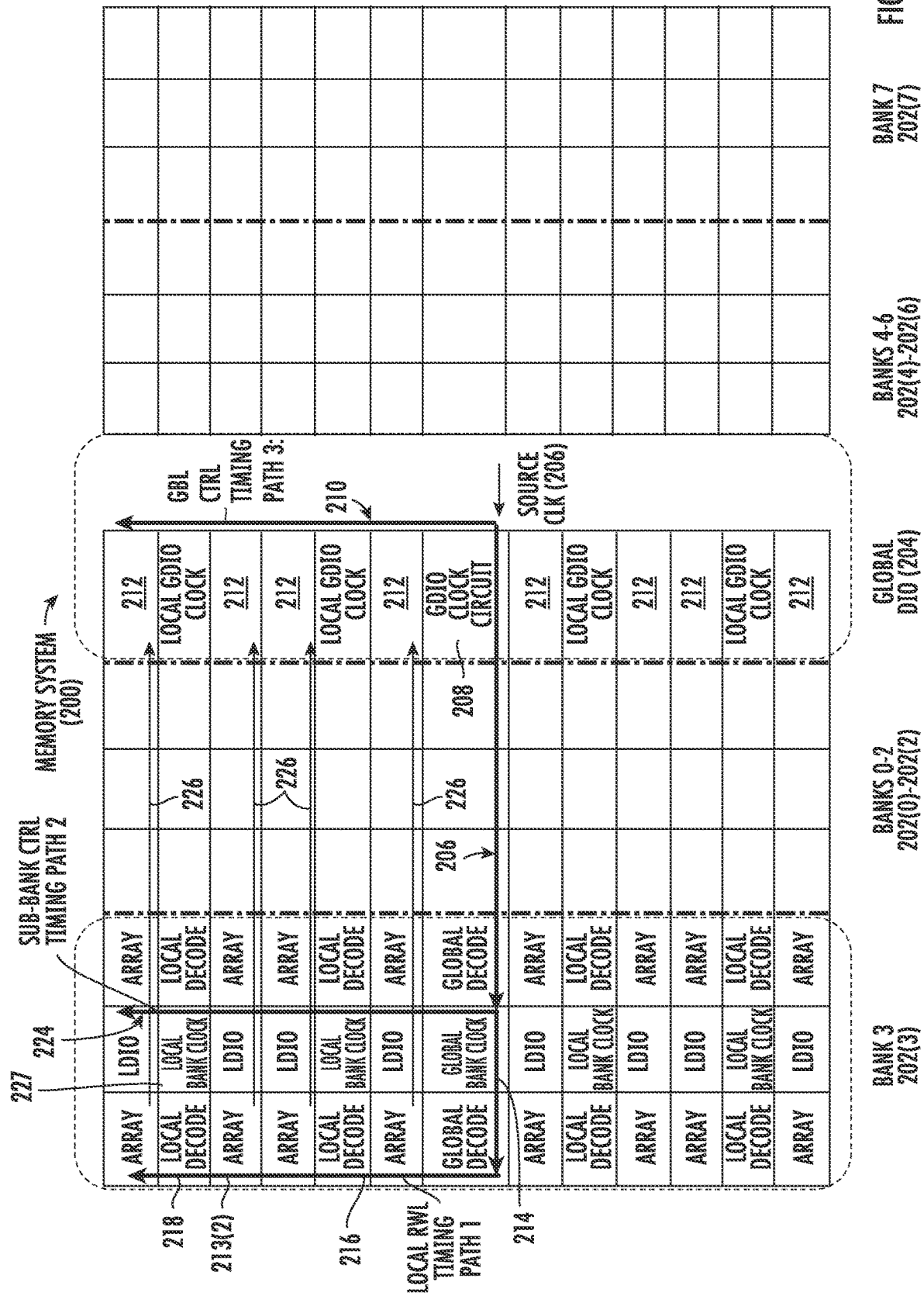

In this regard, FIG. 2 is a diagram of an exemplary memory system 200 that can be included in a memory in the memory system 104 in the processor-based system 100 in FIG. 1 as an example. As shown, the memory system 200 includes eight (8) memory banks 202(0)-202(7) in this example. The memory system 200 also includes a global data input/output (I/O) (GDIO) circuit 204 that includes circuitry that can support each of the memory banks 202(0)-202(7). As discussed below, the GDIO circuit 204 includes circuitry that is involved with generating signals for the selection of the memory bank 202(0)-202(7) to be accessed based on a received memory address. As also discussed below, the GDIO circuit 204 also includes circuitry to provide clock signals sourced from a source clock 206 to clock circuitry in the GDIO circuit 204 and locally to the accessed memory bank 202(0)-202(7) to perform a memory access for the memory address accessed. These clock signals control the timing of the circuitry in the memory system 200 involved with performing a memory access.

With continuing reference to FIG. 2, the GDIO circuit 204 receives the source clock to clock other circuits in the memory system 200 as part of a memory access transaction. The GDIO circuit 204 includes a GDIO clock circuit 208 that generates a GBL clock signal 210 sourced from the source clock 206 to control a selected GBL keeper circuit 212 to latch output read data from a memory array 213(1), 213(2) in a selected memory bank 202(0)-202(7). As shown in a GBL control timing path 3 in FIG. 2, the GBL clock signal 210 is distributed to GBL keeper circuit 212 in the GDIO circuit 204. As shown in the example of an access to memory bank 202(3) in FIG. 2, the GDIO clock circuit 208 also distributes the source clock 206 to the selected memory bank 202(3) to clock circuits involved in a memory access to such memory bank 202(3). In this regard, a global bank clock circuit 214 in the memory bank 202(3) receives the source clock 206. The global bank clock circuit 214 generates a local WL clock signal 216 in a local read WL (RWL) timing path 1 local to the memory bank 202(3) to clock a local decode circuit 218 and optionally memory bit cells (if dynamic bit cells) in a selected memory array 213(1), 213(2) to control the timing of the memory access to such memory bit cells. The global bank clock circuit 214 also generates a sub-bank clock signal 224 in sub-bank control timing path 2 to clock multiplexing circuits 225 to control the multiplexing of output read data from the memory array 213(1), 213(2) in the selected sub-bank of the memory bank 202(3) for a memory read operation, onto GBLs 226 that are configured to be latched by the GBL keeper circuit 212.

In this manner, the different clock signals—the GBL clock signal 210, the local WL clock signal 216, and the sub-bank clock signal 224, are all sourced from the source clock 206 to control the timing of the GDIO circuit 204 and circuits in the selected memory bank 202(3) for a memory access. Thus, the global and local path timings of timing paths 1, 2, and 3 over which these clock signals 210, 216, 224 are distributed need to be tracked to each other to avoid memory data glitches and performance delays. For example, if the GBL clock signal 210 causes the GBL keeper circuit 212 to latch the GBLs 226 before the local WL clock signal 216 and global bank clock circuit 214 causes the new data from a memory read operation to be generated on the GBLs 226, the GBL keeper circuit 212 may be in contention with global bit line driver circuits. On the other hand, if the GBL clock signal 210 is over delayed to delay the latching of the GBL keeper circuit 212, this can keep the GBLs 226 in a floating condition for a longer duration even after the output read data is available, thus increasing memory access time. Providing tracking of these clock signals 210, 216, 224 becomes even more difficult across different PVT variations.

Figure 3:
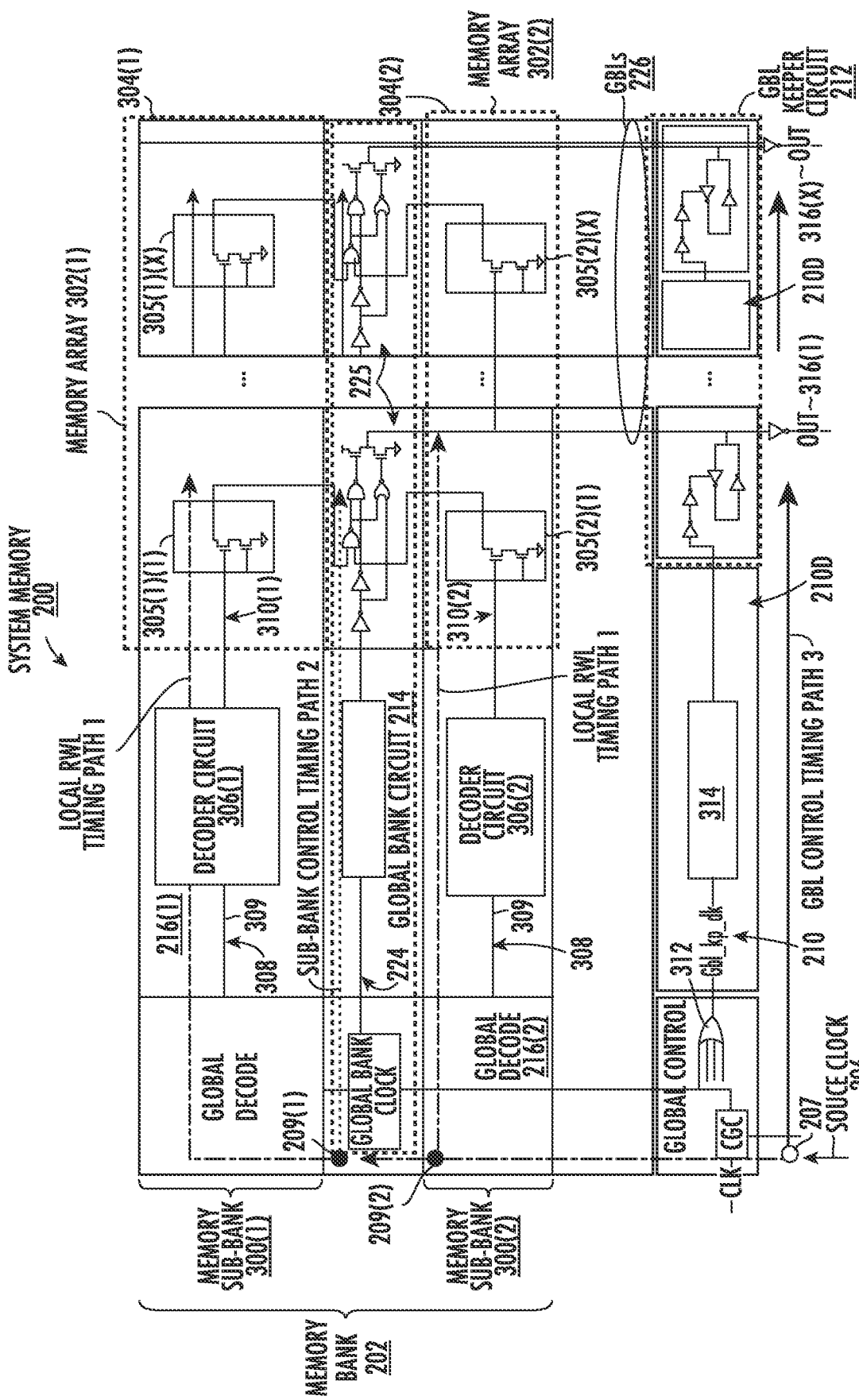
FIG. 3 is a circuit diagram of a memory bank and GBL control path in the memory system in FIG. 2.

A memory bank 202, which can be the memory bank 202(3) in the memory system 200 in FIG. 2, is shown in more detail in FIG. 3. The memory bank 202 is described in more detail below to further illustrate the tracking of the GBL clock signal 210, the local WL clock signal 216, and the sub-bank clock signal 224, and the issues regarding difficulty in tracking across PVT variations. In this regard, the memory bank 202(3) includes two (2) memory sub-banks 300(1), 300(2) in this example. Each memory sub-bank 300(1), 300(2) includes a respective memory array 302(1), 302(2) that each include a plurality of memory row circuits 304(1), 304(2). Only two (2) memory row circuits 304(1), 304(2) are shown, each with respective memory bit cells 305(1)(1)-305(1)(X), 305(2)(1)-305(2)(X). However, note that each memory array 302(1), 302(2) can include a plurality of memory row circuits. In this example, the memory bit cells 305(1)(1)-305(1)(X), 305(2)(1)-305(2)(X) are dynamic static random access memory (DRAM) bit cells that are clocked by a local WL clock signal 216(1), 216(2) in local RWL timing path 1 local to the memory bank 202, as opposed to static random access memory (SRAM) bit cells. Each memory sub-bank 300(1), 300(2) also includes a respective local decoder circuit 306(1), 306(2) that is configured to receive a global decoded memory address as global read word line (RWL) signals 308 (Grwk<31:0>) on global RWLs 309 for a memory operation to select a memory bank 202 for the memory access. The local decoder circuit s 306(1), 306(2) in the selected memory bank 202 are configured to decode such global RWL signals 308 into a local word line (WL) 310(1), 310(2) to select a corresponding memory row circuit 304(1), 304(2) for the memory access. When selected, the memory row circuits 304(1), 304(2) are configured to assert stored bits in their respective memory bit cells 305(1)(1)-305(1)(X), 305(2)(1)-305(2)(X) onto the GBLs 226 to be latched by the GBL keeper circuit 212.

With continuing reference to FIG. 3, the memory bank 202 also includes the global bank clock circuit 214 that generates a sub-bank clock signal 224 in sub-bank control timing path 2 local to memory bank 202 to clock a GBL bank circuit 227. The sub-bank clock signal 224 controls the GBL bank circuit 227 to multiplex output read data from a memory array 302(1), 302(2) in the selected memory sub-bank 300(1), 300(2) of the memory bank 202 for a memory read operation, onto the GBLs 226. The GBLs are configured to be latched by the GBL keeper circuit 212 which is clocked by the GBL clock signal 210 in GBL control timing path 3 in a global area of the memory system 200 outside the memory bank 202, to latch the output read data from a memory array 302(1), 302(2) on the data outputs 316(1)-316(X) coupled to the GBLs 226. The GBL keeper circuit 212 is coupled to each of the GBLs 226. The number of memory bit cells 305(1)(1)-305(1)(X) as well as the number of GBLs 226 is 'X' bits wide. The GBL clock signal 210 is sourced from the source clock 206 at a divergence point 207 in a global area of the memory system 200 as controlled by a global clock gating control (CGC) circuit 312. The GBL clock signal 210 may be delayed by a delay chain circuit 314 to control the timing of the GBL clock signal 210 as the delayed GBL clock signal 210D as part of the control of the tracking of the GBL clock signal 210 to the local WL clock signals 216(1), 216(2).

Thus, as shown in FIG. 3 and described above, the GBL clock signal 210, the local WL clock signals 216(1), 216(2), and the sub-bank clock signal 224 are each sourced from the source clock 206 at divergence point 207. The local WL clock signals 216(1), 216(2) and the sub-bank clock signal 224 diverge at divergence points 209(1), 209(2) locally within the memory bank 202. Thus, these clock signals 210, 216(1),216(2), 224 take different respective circuit timing paths 1, 2, and 3 through the local areas of the memory bank 202 through the memory sub-banks 300(1), 300(2) and the global bank clock circuit 214, and through the GBL keeper circuit 212 in a global area of the memory system 200. The global and local timings of timing paths 1-3 of the memory system 200 need to be coordinated or tracked to each other to avoid memory data glitches and performance delays. The timing of sub-bank control timing path 2 needs to be coordinated with local RWL timing path 1 so that the global bank clock circuit 214 does not multiplex read output data from a memory array 302(1), 302(2) to the GBLs 226 before the memory arrays 302(1), 302(1) generate the read output data affected by the local WL clock signals 216(1), 216(2) in local RWL timing path 1.

Also, the timing of GBL control timing path 3 needs to be coordinated with sub-bank control timing path 2. For example, if the timing of GBL clock signal 210 causes the GBL keeper circuit 212 to latch the GBLs 226 before the sub-bank clock signal 224 causes the new data from a memory read operation to be multiplexed on the GBLs 226, the GBL keeper circuit 212 may be in contention with GBL driver circuits. On the other hand, if the GBL clock signal 210 is over delayed to delay the latching of the GBL keeper circuit 212, this can keep the GBLs 226 in a floating condition for a longer duration even after the output read data is available on the GBLs 226, thus increasing memory access time. Providing tracking of these clock signals becomes even more difficult across different PVT variations.

If the divergence between the GBL clock signal 210, the local WL clock signals 216(1), 216(2), and the sub-bank clock signal 224 can be delayed to a later, local convergence point in the memory bank 202, the difference in timing between timing paths 1-3 can be reduced over PVT variations as compared to the GBL clock signal 210 diverging in a global area of the memory system 200. The GBL clock signal 210, the local WL clock signals 216(1), 216(2), and the sub-bank clock signal 224 can be better tracked to each other over PVT variations, thus minimizing memory glitches and latching errors between timing paths 1-2, and between timing paths 2-3 in the FIG. 3, as described above.

In this regard, FIG. 4 is a circuit diagram of another exemplary memory system 400 that includes a memory bank 402 among one or more memory banks. The memory bank 402 does not include memory sub-banks like shown in the memory system 200 in FIG. 3. The memory system 400 in FIG. 4 is organized like the memory system 200 in FIG. 2, wherein the memory bank 402 could be like a memory bank 202(0)-202(7) in the memory system 200 in FIG. 2. The memory bank 402 includes a memory array 403 that includes one or more memory row circuits 404. Only one memory row circuit 404 is shown, but note that the memory array 403 could include a plurality of the memory row circuits 404. As discussed in more detail below, it is desired to reduce the divergence path between the timing path that controls the assertion of output read data 420 from a selected memory row circuit 404 in the memory array 403 onto GBLs 426(0)-426(X), and the timing path controls the a GBL keeper circuit 412 that latches the output read data 420. In this regard, as discussed in more detail below, the local WL clock signal 416 that controls a local RWL timing path 1 of a selected memory row circuit 404 in the memory bank 402, and a GBL clock signal 411 that controls a GBL control timing path 3 controlling the timing of the latching of the output read data 420 from the GBLs 426(0)-426(X), are both sourced locally from the source clock 206 locally within the memory bank 402. In this regard, the local WL clock signal 416 that controls the local RWL timing path 1 and the GBL clock signal 411 that controls the GBL control timing path 3 diverge within the local memory bank 402, as opposed to a global divergence point in the memory system 400 outside the memory bank 402, like provided in the memory system 200 in FIG. 3. In this manner, the divergence between the local RWL timing path 1 and the GBL control timing path 3 is reduced, and thus can better designed to track each other over PVT variations, thus minimizing memory glitches and latching errors between timing paths 1 and 3.

With reference to FIG. 4, each memory row circuit 404 includes a plurality of memory bit cells 405(0)-405(X) organized in a row. For example, the memory bit cells 405(0)-405(X) could be SRAM bit cells or DRAM bit cells. In this example, the memory bit cells 405(0)-405(X) are DRAM bit cells that are clocked by a local WL clock signal 416 in local RWL timing path 1 local to the memory bank 402. The memory system 400 includes a global decode circuit 434 that is configured to decode a received memory address 436 for a memory access operation into a global decoded memory address to generate a global RWL signals 408 on global RWLs 409 (Grwl<31:0>) for a selected memory bank 402. The memory bank 402 includes a respective local decoder circuit 406 that is configured to receive the global RWL signals 408 and generate local word line (WL) signals 410 on local WLs 413 corresponding a particular memory row circuit 404 in the memory array 403 for the memory access. When selected in a memory read operation, the memory row circuit 404 is configured to assert stored data bits in their respective memory bit cells 405(0)-405(X) as output read data 420 onto respective GBLs 426(0)-426(X). The timing of the assertion of the data bits in their respective memory bit cells 405(0)-405(X) as output read data 420 onto respective GBLs 426(0)-426(X) is controlled by the local WL clock signal 416. GBL latches 432(0)-432(2) in a GBL keeper circuit 412 are coupled to the GBLs 426(0)-426(X) and are configured to latch the output read data 420 from the respective GBLs 426(0)-426(X) in response to a delayed GBL clock signal 411D that is a delayed version of the GBL clock signal 411. A delay circuit 435 is provided in GBL control timing path 3 to control the delay of the GBL clock signal 411 into the delayed GBL clock signal 411D.

With continuing reference to FIG. 4, the memory bank 402 includes a global bank clock circuit 414 that is configured to receive from source clock 206 and provide the source clock to a clock control generation circuit 440. The clock control generation circuit 440 includes a local clock node 442. The clock control generation circuit 440 is configured to receive the global RWL signals 408 on the global RWLs 409 for a memory read operation. The clock control generation circuit 440 is then configured to generate the first local WL clock signal 416 sourced from the source clock 206 on the local clock node 442. The clock control generation circuit 440 is also configured to generate the GBL clock signal 411 sourced from the source clock 206 also on the local clock node 442. The GBL keeper circuit 412 includes a GBL clock input 446 that is coupled to the local clock node 442 and that receives the GBL clock signal 411 sourced from the source clock 206. The first local WL clock signal 416 and the GBL clock signal 411 are sourced both source from the source clock 206, but first local WL clock signal 416 and the GBL clock signal 411 don't diverge into their respective local RWL timing path 1 and GBL control timing path 3 until divergence point 444 at the local clock node 442, which is locally within the selected memory bank 402. In this manner, the divergence between the local RWL timing path 1 and the GBL control timing path 3 is reduced, and thus can better designed to track each other over PVT variations, thus minimizing memory glitches and latching errors between timing paths 1 and 3.

In this example of the memory system 400 in FIG. 4, it is desired to control the clock control generation circuit 440 to only distribute the source clock 206 to the local clock node 422 when its memory bank 402 is selected. This is so that clock control generation circuit 440 in the memory bank 402 does not clocking circuits in the local RWL timing path 1 in its memory bank 402 when its memory bank 402 is not selected. It is also desired that the clock control generation circuit 440 in the memory bank 402 does not clocking circuits in the GBL control timing path 3 when its memory bank 402 is not selected, so that the GBL keeper circuit 412 can be clocked based on the other accessed memory bank in the memory system 400 without conflict.

In this regard, as shown in FIG. 4, the clock control generation circuit 440 also includes an OR-based logic circuit 448 that is coupled to the global RWLs 409. An OR-based logic circuit is a circuit that is configured to perform an OR logic operation (e.g., an OR, NOR, XOR) on inputs to generate the output as the result of the logic operation. The OR-based logic circuit 448 is configured to perform a OR-based logic operation on the global RWL signals 408 on the global RWLs 409. In this example, to provide the OR-based logic circuit 448, a plurality of pull-down circuits 450 (e.g., an N-type field effect transistor (NFET)). Only one pull-down circuit 450 is shown pictorially in FIG. 4, but note that each of the global RWLs 409 are coupled to a respective gate of a respective pull-down circuit 450. In this manner, when a global read WL signal 408 is active, its respective coupled pull-down circuit 450 is activated. Because the global RWLs 409 are one-active hot WLs, only one of the pull-down circuit 450 is activated when the respective memory bank 402 is accessed. Each of the pull-down circuits 450 is coupled to the clock control output 452 that is coupled to a clock controller 454 (e.g., a NAND gate). The clock control output 452 controls the outputting of the source clock 206 by the global bank clock circuit 414 onto the local clock node 442 by controlling the clock controller 454. If any of the pull-down circuits 450 pulls down the clock control output 452, the clock controller 454 distributes the source clock 206 to the local clock node 442. If none of the pull-down circuits 450 pulls down the clock control output 452, the clock controller 454 does not distribute the source clock 206 to the local clock node 442. In this manner, a global RWL signal 408 has to be active, indicating its memory bank 402 has been selected in order for the clock control generation circuit 440 to distribute the source clock 206 to the local clock node 442 to generate the local WL clock signal 416 and the GBL clock signal 411.

Note that the clock control output 452 does not have to be pre-charged. Also note that alternatively, instead of the OR-based logic circuit 448 include pull-down circuits 450, the OR-based logic circuit 448 could include pull-up circuits that are configured to charge the clock control output 452 in response to its coupled global RWL signal 408 being activated. In this alternative, the clock control output 452 does not have to be pre-discharged.

FIG. 5 is a flowchart illustrating an exemplary read operation process 500 performed in a selected memory row circuit in a selected memory bank in a memory system, wherein the GBL clock signal and local WL clock signal local are both sourced locally from a source clock within the memory bank. The exemplary read operation process 500 in FIG. 5 is discussed with regard to the exemplary memory system 400 in FIG. 4.

In this regard, a first step in the read operation process 500 is receiving the source clock 206 (block 502 in FIG. 5). A next step in the read operation process 500 is receiving the first global RWL signal 408 on the plurality of global RWLs 409 indicating a first read operation to a selected first memory row circuit 404 of the plurality of first memory row circuits 404 (block 504 in FIG. 5). In response to receiving the first global RWL signal 408 (block 506 in FIG. 5), next steps can be generating the first local WL clock signal 416 from the received source clock 206 on the local clock node 442 (block 508 in FIG. 5), generating the GBL clock signal 411 from the received source clock 206 on the local clock node 442 (block 510 in FIG. 5), and generating the first output read data 420 from the selected first memory row circuit 404 to be coupled on the plurality of GBLs 426(0)-426(X) in response to the first global RWL signals 408 on the plurality of global RWLs 409 indicating the selection of the first memory row circuit 404 and the first local WL clock signal 416 (block 512 in FIG. 5). A next step in the read operation process 500 can be latching the first output read data 420 on the plurality of GBLs 426(0)-426(X) in response to the GBL clock signal 411 (block 514 in FIG. 5).

The local sourcing of a GBL clock signal and local WL clock signal from a source clock within a memory bank of a memory system can also be provided in a memory system where its memory banks further include memory sub-banks. In such a system, the memory bank can further include a sub-bank control circuit that includes clocked circuits that control the multiplexing the output read data from a selected memory sub-bank within the memory bank, onto GBLs to be latched by a GBL keeper circuit. This sub-bank control circuit has a separate clocked timing path based on a clock signal that is source from a source clock. It may also be desired to minimize the divergence of this timing path from a local RWL timing path for a selected memory sub-bank as well as a GBL control timing path for the GBL keeper circuit to minimize the divergence in path lengths of such timing paths.

In this regard, FIG. 6 is a circuit diagram of another exemplary memory system 600 that includes a memory bank 602 with multiple memory sub-banks 603(1), 603(2). Common elements between the memory system 400 in FIG. 4 and the memory system 600 in FIG. 6 are shown with common element numbers and are not re-described. As discussed in more detail below, the GBL clock signal 411 in the GBL control timing path 3, local WL clock signals 416, 616 in RWL timing paths 1.*a*, 1.*b* within the respective memory sub-banks 603(1), 603(2), and a sub-bank control clock signal 666 in sub-bank control timing path 2, are all sourced from the source clock 206 locally within the memory bank 602 to minimize the path length divergence between such timing paths.

In this regard, as shown in FIG. 6, the memory system 400 includes the memory bank 602 that includes a memory array 605 that includes the two (2) memory sub-banks 603(1), 603(2). The memory sub-bank 603(1) is the memory bank 402 in the memory system 400 in FIG. 4. The second memory sub-bank 603(2) is essentially identical to the first memory sub-bank 603(1). The second memory sub-bank 603(2) includes a plurality of the memory row circuits 604 that each include a plurality of memory bit cells 607(0)-607(X) organized in a row. For example, the memory bit cells 607(0)-607(X) could be SRAM bit cells or DRAM bit cells. In this example, the memory bit cells 607(0)-607(X) are DRAM bit cells that are clocked by a local WL clock signal 616 in local RWL timing path 1.*b* local to the sub-memory bank 603(2). The memory bit cells 607(0)-607(X) in the memory row circuit 404 in the memory sub-bank 603(1) are clocked by the local WL clock signal 416 in local RWL timing path 1.*a* local to the sub-memory bank 603(1). As discussed above for the memory system 400 in FIG. 4, the memory system 600 in FIG. 6 includes another global decode circuit 634 for memory sub-bank 603(2) that is configured to decode a received memory address 436 for a memory access operation into a global decoded memory address to generate a global RWL sig on global RWLs 409 (Grwl<31:0>) for a selected memory sub-bank 603(1), 603 (2). The memory sub-bank 603(2) includes a respective local decoder circuit 606 that is configured to receive the global RWL signals 408 and generate local WL signals 610 on local WLs 613 corresponding a particular memory row circuit 604 in the memory sub-bank 603(2) for the memory access. When selected in a memory read operation, the memory row circuit 604 is configured to assert stored data bits in their respective memory bit cells 607(0)-607(X) as the output read data 420 onto respective GBLs 426(0)-426(X). The timing of the assertion of the data bits in their respective memory bit cells 607(0)-607(X) as output read data 420 onto respective GBLs 426(0)-426(X) is controlled by the local WL clock signal 616.

With continuing reference to FIG. 6, in addition to the first local WL clock signal 416, in this example, a clock control generation circuit 640 is also configured to generate the second local WL clock signal 616 sourced from the source clock 206 at divergence point 444 on the local clock node 442. In this example of the memory system 600 in FIG. 6, it is desired to control the clock control generation circuit 640 to only distribute the source clock 206 to the local clock node 422 when either of the memory sub-banks 603(1), 603(2) are selected. This is so that clock control generation circuit 640 in the memory bank 602 does not clock circuits in the local RWL timing path 1.*a* or local RWL timing path 1.*b* in the respective memory sub-banks 603(1), 603(2) when not selected. It is also desired that the clock control generation circuit 440 in the memory bank 602 does not clock circuits in the GBL control timing path 3 when one of its memory sub-banks 603(1), 603(2) is not selected, so that the GBL keeper circuit 412 can be clocked based on the other accessed memory bank in the memory system 600 without conflict.

In this regard, as shown in FIG. 6, the clock control generation circuit 640 also includes an OR-based logic circuit 648 that is coupled to the global RWLs 409. The OR-based logic circuit 648 is like the OR-based logic circuit 448. The clock control generation circuit 640 is configured to perform a OR-based logic operation on the global RWL signals 408 on the global RWLs 409 for the second memory sub-bank 603(2). In this example, to provide the OR-based logic circuit 648, a plurality of pull-down circuits 650 (e.g., an N-type field effect transistor (NFET)). Only one pull-down circuit 650 is shown pictorially in FIG. 6, but note that each of the global RWLs 409 are coupled to a respective gate of a respective pull-down circuit 650. In this manner, when a global read WL signal 408 is active selecting memory sub-bank 603(2), its respective coupled pull-down circuit 650 is activated. Because the global RWLs 409 are one-active hot WLs, only one of the pull-down circuit 450 is activated when the respective memory sub-bank 603(2) is accessed. Each of the pull-down circuits 650 is coupled to the clock control output 652 that is coupled to the clock controller 454 (e.g., a NAND gate) to control the outputting of the source clock 206 by the global bank clock circuit 414 onto the local clock node 442 by controlling the clock controller 454. If any of the pull-down circuits 650 pulls down the clock control output 652, the clock controller 454 distributes the source clock 206 to the local clock node 442. If none of the pull-down circuits 650 pulls down the clock control output 452, the clock controller 454 does not distribute the source clock 206 to the local clock node 442. In this manner, a global RWL signal 408 has to be active, indicating one or the memory sub-banks 603(1), 603(2) has been selected, in order for the clock control generation circuit 440 to distribute the source clock 206 to the local clock node 442 to generate the respective local WL clock signals 416, 616 and the GBL clock signal 411.

Note that the clock control output 452 does not have to be pre-charged. Also note that alternatively, instead of the OR-based logic circuits 448, 648 including pull-down circuits 450, 650, the OR-based logic circuits 448, 648 could include pull-up circuits that are configured to charge the clock control output 452 in response to its coupled global RWL signal 408 being activated. In this alternative, the clock control output 452 does not have to be pre-discharged.

With continuing reference to FIG. 6, the memory system 600 also includes a memory sub-bank control circuit 660 that is configured to multiplex the asserts data bits from a selected memory row circuit 404, 604 that are asserted onto the GBLs 426(0)-426(X). This is so that there is not a conflict of the signal levels on the GBLs 426(0)-426(X) in response to a read operation to the memory bank 602, because only one of the memory sub-banks 603(1), 603(2) is selected in a memory read operation to validly assert the output read data 420 onto the GBLs 426(0)-426(X). In this regard, the memory sub-bank control circuit 660 includes a plurality of multiplexing circuits 662(0)-662(X) that control which memory sub-bank's 603(1)-603(2) respective memory bit cells 405(0)-405(X), 607(0)-607(X) in a respective selected memory row circuit 404, 604, are coupled to the GBLs 426(0)-426(X), based on the respective local WL signals 410, 610. The multiplexing circuits 662(0)-662(X) also need to be controlled by a clock signal that is sourced from the source clock 206. In this regard, the multiplexing circuits 662(0)-662(X) are also coupled to a local bank clock circuit 664 that is coupled to the local clock node 442 at the divergence point 444. The local bank clock circuit 664 provides a sub-bank control clock signal 666 to clock circuits in the memory sub-bank control circuit 660 in sub-bank control timing path 2 sourced from the source clock 206 on the local clock node 442. In this manner, the divergence of the sub-bank control timing path 2 also occurs locally within the selected memory bank 602 at the local clock node 442 in this example, and starts at the same local clock node 442 as the local RWL timing paths 1.a and 1.b and the GBL control timing path 3 for improved timing path tracking.

FIG. 7 is a block diagram of an exemplary processor-based system 700 that includes a processor 702 configured to execute computer instructions for execution. The processor-based system also includes a memory system 704 that is configured to generate a GBL clock signal and local WL clock signal locally within a memory bank that control the timing of the respective GBL control path and a WL path in a selected memory row circuit in the memory bank. The GBL clock signal and the WL clock signal are both sourced locally from a source clock 706 within the memory bank of the memory system 704. The memory system 704 in FIG. 7 could include the memory systems 400, 600 in FIGS. 4 and 6 as non-limiting examples.

With continuing reference to FIG. 7, the processor-based system 700 may be a circuit or circuits included in an electronic board card, such as, a printed circuit board (PCB), a server, a personal computer, a desktop computer, a laptop computer, a personal digital assistant (PDA), a computing pad, a mobile device, or any other device, and may represent, for example, a server or a user's computer. The processor 702 represents one or more general-purpose processing circuits, such as a microprocessor, central processing unit, or the like. The processor 702 is configured to execute processing logic in computer instructions for performing the operations and steps discussed herein. The processor 702 also includes an instruction cache 708 for temporary, fast access memory storage of instructions. Fetched or prefetched instructions from a memory, such as from a system memory 710 over a system bus 712, are stored in the instruction cache 708.

The processor 702 and the system memory 710 are coupled to the system bus 712 and can intercouple peripheral devices included in the processor-based system 700. As is well known, the processor 702 communicates with these other devices by exchanging address, control, and data information over the system bus 712. For example, the processor 702 can communicate bus transaction requests to a memory controller 714 in the system memory 710 as an example of a slave device. Although not illustrated in FIG. 7, multiple system buses 712 could be provided, wherein each system bus constitutes a different fabric. In this example, the memory controller 714 is configured to provide memory access requests to a memory array 716 in the system memory 710. The memory array 716 is comprised of an array of storage bit cells for storing data. The system memory 710 may be a read-only memory (ROM), flash memory, dynamic random access memory (DRAM), such as synchronous DRAM (SDRAM), etc., and a static memory (e.g., flash memory, static random access memory (SRAM), etc.), as non-limiting examples.

Other devices can be connected to the system bus 712. As illustrated in FIG. 7, these devices can include the system memory 710, one or more input device(s) 718, one or more output device(s) 720, a modem 722, and one or more display controllers 724, as examples. The input device(s) 718 can include any type of input device, including but not limited to input keys, switches, voice processors, etc. The output device(s) 720 can include any type of output device, including but not limited to audio, video, other visual indicators, etc. The modem 722 can be any device configured to allow exchange of data to and from a network 726. The network 726 can be any type of network, including but not limited to a wired or wireless network, a private or public network, a local area network (LAN), a wireless local area network (WLAN), a wide area network (WAN), a BLUETOOTH™ network, and the Internet. The modem 722 can be configured to support any type of communications protocol desired. The processor 702 may also be configured to access the display controller(s) 724 over the system bus 721 to control information sent to one or more displays 728. The display(s) 728 can include any type of display, including but not limited to a cathode ray tube (CRT), a liquid crystal display (LCD), a plasma display, etc.

The processor-based system 700 in FIG. 7 may include a set of instructions 730 that when executed by a processor, such as processor 702, generate a GBL clock signal and local WL clock signal locally within a memory bank that control the timing of the respective GBL control path and a WL path in a selected memory row circuit in the memory bank. The instructions 730 may be stored in the system memory 710, processor 702, and/or instruction cache 708 as examples of non-transitory computer-readable medium 732. The instructions 730 may also reside, completely or at least partially, within the system memory 710 and/or within the processor 702 during their execution. The instructions 730 may further be transmitted or received over the network 726 via the modem 722, such that the network 726 includes non-transitory computer-readable medium 732, or the input device 718 as other examples.

While the non-transitory computer-readable medium 732 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory (RAM), a magnetic disk storage medium, an optical storage medium, flash memory devices, etc.) and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories, registers, or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium, and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be referenced throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A memory system, comprising:
   a first memory array, comprising:
      a plurality of first memory row circuits; and
      each first memory row circuit of the plurality of first memory row circuits configured to generate a first output read data to be coupled on a plurality of global bit lines (GBLs) in response to first global read word line (RWL) signals on a plurality of global RWLs indicating the selection of a first memory row circuit of the plurality of first memory row circuits for a first read operation, and in response to a first local WL clock signal;
   a GBL keeper circuit coupled to the plurality of GBLs;
      the GBL keeper circuit configured to latch the first output read data on the plurality of GBLs in response to a GBL clock signal; and
   a clock control generation circuit comprising a local clock node,
   the clock control generation circuit configured to:
      receive a source clock;
      receive the first global RWL signals over the plurality of global RWLs indicating the first read operation into the first memory array; and
      in response to receiving the first global RWL signals:
         generate the first local WL clock signal from the received source clock on the local clock node; and
         generate the GBL clock signal from the received source clock on the local clock node.

2. The memory system of claim 1, further comprising a global decode circuit configured to:
   receive a memory address for a read operation;
   decode the received memory address into a global decoded memory address; and
   generate the first global RWL signals based on the global decoded memory address.

3. The memory system of claim 1, wherein each first memory row circuit of the plurality of first memory row circuits comprises a plurality of first memory bit cells.

4. The memory system of claim 1, wherein the first memory array further comprises a local row decode circuit configured to:
   decode the global RWL signals into a local decoded memory address; and
   activate the first memory row circuit of the plurality of first memory row circuits based on the local decoded memory address, to generate the first output read data to be coupled on the plurality of GBLs in response to the first local WL clock signal.

5. The memory system of claim 1, wherein the GBL keeper circuit further comprises a GBL clock input coupled to the local clock node, and the GBL keeper circuit is further configured to receive the GBL clock signal on the GBL clock input.

6. The memory system of claim 1, wherein the clock control generation circuit further comprises a first OR-based logic circuit coupled to the plurality of global RWLs,
   the clock control generation circuit configured to:
      perform a first OR-based logic operation on the first global RWL signals on the plurality of global RWLs; and
      generate the GBL clock signal from the received source clock on the local clock node based on the OR-based logic operation.

7. The memory system of claim 6, wherein the OR-based logic circuit comprises a plurality of pull-down circuits each coupled to a respective global RWL of the plurality of global RWLs and coupled to a clock control output, and a clock controller;
   each of the plurality of pull-down circuits configured to discharge the clock control output in response to its respective coupled global RWL being activated; and
   the clock controller configured to generate the GBL clock signal onto the local clock node in response to the discharge of the clock control output.

8. The memory system of claim 7 configured to not pre-charge the clock control output.

9. The memory system of claim 6, wherein the OR-based logic circuit comprises a plurality of pull-up circuits each coupled to a respective global RWL of the plurality of global RWLs and coupled to a clock control output, and a clock controller;
   each of the plurality of pull-up circuits configured to charge the clock control output in response its respective coupled global RWL being activated; and
   the clock controller configured to generate the GBL clock signal onto the local clock node in response to the charge of the clock control output.

10. The memory system of claim 9 configured to not pre-discharge the clock control output.

11. The memory system of claim 1, further comprising:
    a first memory bank, comprising:
       a first memory sub-bank comprising the first memory array; and
       a second memory sub-bank comprising a second memory array, comprising:
          a plurality of second memory row circuits; and
          each second memory row circuit of the plurality of second memory row circuits configured to generate a second output read data to be coupled on the plurality of GBLs in response to second global RWL signals on a plurality of global RWLs indicating the selection of a second memory row circuit of the plurality of second memory row circuits for a second read operation, and in response to a second local WL clock signal; and
    wherein:
       the GBL keeper circuit is further configured to latch the second output read data on the plurality of GBLs in response to a GBL clock signal; and
    the clock control generation circuit further configured to:
       receive the second global RWL signals over the plurality of global RWLs indicating the second read operation into the second memory array; and
       in response to receiving the second global RWL signals:
          generate the second local WL clock signal from the received source clock on the local clock node; and
          generate the GBL clock signal from the received source clock on the local clock node.

12. The memory system of claim 11, wherein:
the clock control generation circuit further comprises a second OR-based logic circuit coupled to the plurality of global RWLs; and
the clock control generation circuit configured to:
   perform a second OR-based logic operation on the second global RWL signals on the plurality of global RWLs to generate GBL clock signal; and
   generate the GBL clock signal from the received source clock on the local clock node based on the second OR-based logic operation.

13. The memory system of claim 12, wherein:
each first memory row circuit of the plurality of first memory row circuits comprises a plurality of first memory bit cells;
each second memory row circuit of the plurality of second memory row circuits comprises a plurality of second memory bit cells; and
the memory bank further comprises a memory sub-bank control circuit that comprises:
   a first plurality of multiplexing circuits each coupled to a first memory bit cell among the plurality of first memory bit cells in each first memory row circuit of the plurality of first memory row circuits, and a GBL of the plurality of GBLs; and
   a second plurality of multiplexing circuits each coupled to a second memory bit cell among the plurality of second memory bit cells in each second memory row circuit of the plurality of second memory row circuits, and a GBL of the plurality of GBLs;
the memory sub-bank control circuit configured to:
   couple the first output read data to the plurality of GBLs in response to the first global RWL signals on the plurality of global RWLs indicating the selection of the first memory row circuit, and a memory sub-bank control clock signal; and
   couple the second output read data to the plurality of GBLs in response to the second global RWL signals on the plurality of global RWLs indicating the selection of the second memory row circuit, and the memory sub-bank control clock signal.

14. The memory system of claim 13, wherein
the clock control generation circuit is further configured to:
   in response to receiving the first global RWL signals:
      generate the memory sub-bank control clock signal from the received source clock on the local clock node; and
   in response to receiving the second global RWL signals:
      generate the memory sub-bank control clock signal from the received source clock on the local clock node.

15. A method of generating a global bit line (GBL) clock signal clocking a GBL keeper circuit in a memory system, comprising:
receiving a source clock;
receiving first global read word line (RWL) signals on a plurality of global RWLs indicating a first read operation to a selected first memory row circuit of a plurality of first memory row circuits; and
in response to receiving the first global RWL signals:
   generating a first local WL clock signal from the received source clock on a local clock node;
   generating a GBL clock signal from the received source clock on the local clock node; and
   generating a first output read data from the selected first memory row circuit to be coupled on a plurality of GBLs in response to the first global RWL signals on the plurality of global RWLs indicating the selection of the first memory row circuit and the first local WL clock signal; and
latching the first output read data on the plurality of GBLs in response to the GBL clock signal.

16. The method of claim 15, further comprising:
receiving a memory address for a read operation;
decoding the received memory address into a global decoded memory address; and
generate the first global RWL signals based on the global decoded memory address.

17. The method of claim 15, further comprising:
performing an OR-based logic operation on the first global RWL signals on the plurality of global RWLs;
generating the GBL clock signal from the received source clock on the local clock node based on the OR-based logic operation.

18. The method of claim 17, wherein performing the OR-based logic operation on the first global RWL signals comprises:
discharging a clock control output in response to a global RWL of the plurality of global RWLs being activated; and
generating the GBL clock signal from the received source clock in response to the discharging of the clock control output.

19. The method of claim 18 further comprising not pre-charging the local clock node.

20. The method of claim 17, wherein performing the OR-based logic operation on the first global RWL signals the OR-based logic circuit comprises:
charging a clock control output in response global RWL of the plurality of global RWLs being activated; and
generating the GBL clock signal from the received source clock in response to the charging of the clock control output.

21. The method of claim 20 further comprising pre-discharging the local clock node.

22. The method of claim 15, further comprising:
receiving a second global RWL signals on the plurality of global RWLs indicating a second read operation to a selected second memory row circuit of a plurality of second memory row circuits; and
in response to receiving the second global RWL signals:
   generating a second local WL clock signal from the received source clock on the local clock node;
   generating the GBL clock signal from the received source clock on the local clock node; and
   generating a second output read data from the selected second memory row circuit to be coupled on the plurality of GBLs in response to the second global RWL signals on the plurality of global RWLs indicating the selection of the second memory row circuit and the second local WL clock signal; and
latching the second output read data on the plurality of GBLs in response to the GBL clock signal.

23. The method of claim 22, further comprising:
performing a second OR-based logic operation on the second global RWL signals on the plurality of global RWLs; and
generating the GBL clock signal from the received source clock on the local clock node based on the second OR-based logic operation.

24. The method of claim 23, further comprising:

coupling the first output read data to the plurality of GBLs in response to the first global RWL signals on the plurality of global RWLs indicating the selection of the first memory row circuit, and in response to a memory sub-bank control clock signal; and coupling the second output read data to the plurality of GBLs in response to the second global RWL signals on the plurality of global RWLs indicating the selection of the second memory row circuit, and in response to the memory sub-bank control clock signal.

25. The method of claim 24, further comprising, in response to receiving the first global RWL signals, generating the memory sub-bank control clock signal from the received source clock on the local clock node; and in response to receiving the second global RWL signals, generating the memory sub-bank control clock signal from the received source clock on the local clock node.

* * * * *